United States Patent
Yamauchi et al.

(10) Patent No.: US 6,524,052 B1
(45) Date of Patent: Feb. 25, 2003

(54) ELECTRONIC PARTS-FEEDING TRAY FEEDER AND ELECTRONIC PARTS-FEEDING METHOD

(75) Inventors: Jun Yamauchi, Kurume (JP); Yuji Tanaka, Kurume (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/548,349

(22) Filed: Apr. 12, 2000

(30) Foreign Application Priority Data

Apr. 22, 1999 (JP) .......................... 11-114463

(51) Int. Cl.$^7$ ............................... B65G 1/06
(52) U.S. Cl. ..................... 414/331.1; 414/222.01; 414/286; 414/331.11; 414/416.08; 414/806; 414/811
(58) Field of Search .................. 414/222.01, 268, 414/270, 280, 286, 331.06, 331.1, 331.11, 416.07, 416.08, 609, 806, 807, 811

(56) References Cited

U.S. PATENT DOCUMENTS

| | | | | |
|---|---|---|---|---|
| 4,277,216 A | * | 7/1981 | Lindberg ................ 414/285 |
| 4,588,341 A | * | 5/1986 | Motoda ................ 414/331.14 |
| 4,593,820 A | * | 6/1986 | Antonie et al. ............. 209/573 |
| 4,844,680 A | * | 7/1989 | Kawata et al. ............. 414/282 |
| 4,868,973 A | * | 9/1989 | Fujishiro ................ 29/740 |
| 4,946,340 A | * | 8/1990 | Murphy et al. ............ 294/87.1 |
| 5,024,593 A | * | 6/1991 | Hehl ........................ 425/556 |
| 5,085,553 A | * | 2/1992 | Bouwens et al. ........... 414/331 |
| 5,120,178 A | * | 6/1992 | Ito ......................... 414/222.07 |
| 5,190,434 A | * | 3/1993 | Miura et al. ............. 414/416.11 |
| 5,203,661 A | * | 4/1993 | Tanita et al. ............... 414/280 |
| 5,348,441 A | * | 9/1994 | Takemasa et al. ....... 414/796.7 |
| 5,355,579 A | * | 10/1994 | Miyasaka et al. ............. 29/712 |
| 5,451,132 A | * | 9/1995 | Tokiwa ................. 414/416.05 |
| 5,490,752 A | * | 2/1996 | Tokiwa et al. ............. 414/280 |
| 5,498,122 A | * | 3/1996 | Miura et al. ............. 414/778.7 |
| 5,645,392 A | * | 7/1997 | Leichty et al. ............. 414/416 |
| 5,692,867 A | * | 12/1997 | Kondo et al. ............... 414/268 |
| 5,810,541 A | * | 9/1998 | Casey et al. ............... 105/141 |
| 5,882,174 A | * | 3/1999 | Woerner et al. ......... 414/788.7 |
| 6,036,425 A | * | 3/2000 | Seto .................... 414/222.07 |
| 6,152,682 A | * | 11/2000 | Araki .................... 414/225.01 |
| 6,227,373 B1 | * | 5/2001 | Stuckey et al. ............ 209/3.1 |
| 6,239,396 B1 | * | 5/2001 | Kang .................... 209/573 |
| 6,241,459 B1 | * | 6/2001 | Canella et al. ........... 414/798.1 |
| 6,283,695 B1 | * | 9/2001 | Nakagawa et al. ......... 414/416 |
| 6,413,035 B1 | * | 7/2002 | Kaneko ................ 414/796.9 |
| 6,422,801 B1 | * | 7/2002 | Solomon ................ 414/416.07 |

* cited by examiner

Primary Examiner—James W. Keenan
(74) Attorney, Agent, or Firm—Stevens, Davis, Miller & Mosher, LLP

(57) ABSTRACT

A tray feeder sequentially takes pallets, each holding a tray storing electronic parts, out of a magazine and feeds them to a pick-up position where the electronic parts are picked up by a transfer head of an electronic parts-mounting apparatus. The tray feeder comprises the magazines for containing the pallets in a stacked manner, a drawing portion for drawing the pallet from the magazine and carrying the same thereon, a lifting-lowering portion for vertically moving the drawing portion, a non-mounted-parts discharge portion provided above the magazines, and a replenishing portion for receiving the pallet, holding the empty tray from which the electronic parts have been picked up, and for recharging the pallet after fresh electronic parts are replenished. With this construction, there can be achieved the tray feeder that is excellent in the operation efficiency and is compact in size.

3 Claims, 6 Drawing Sheets

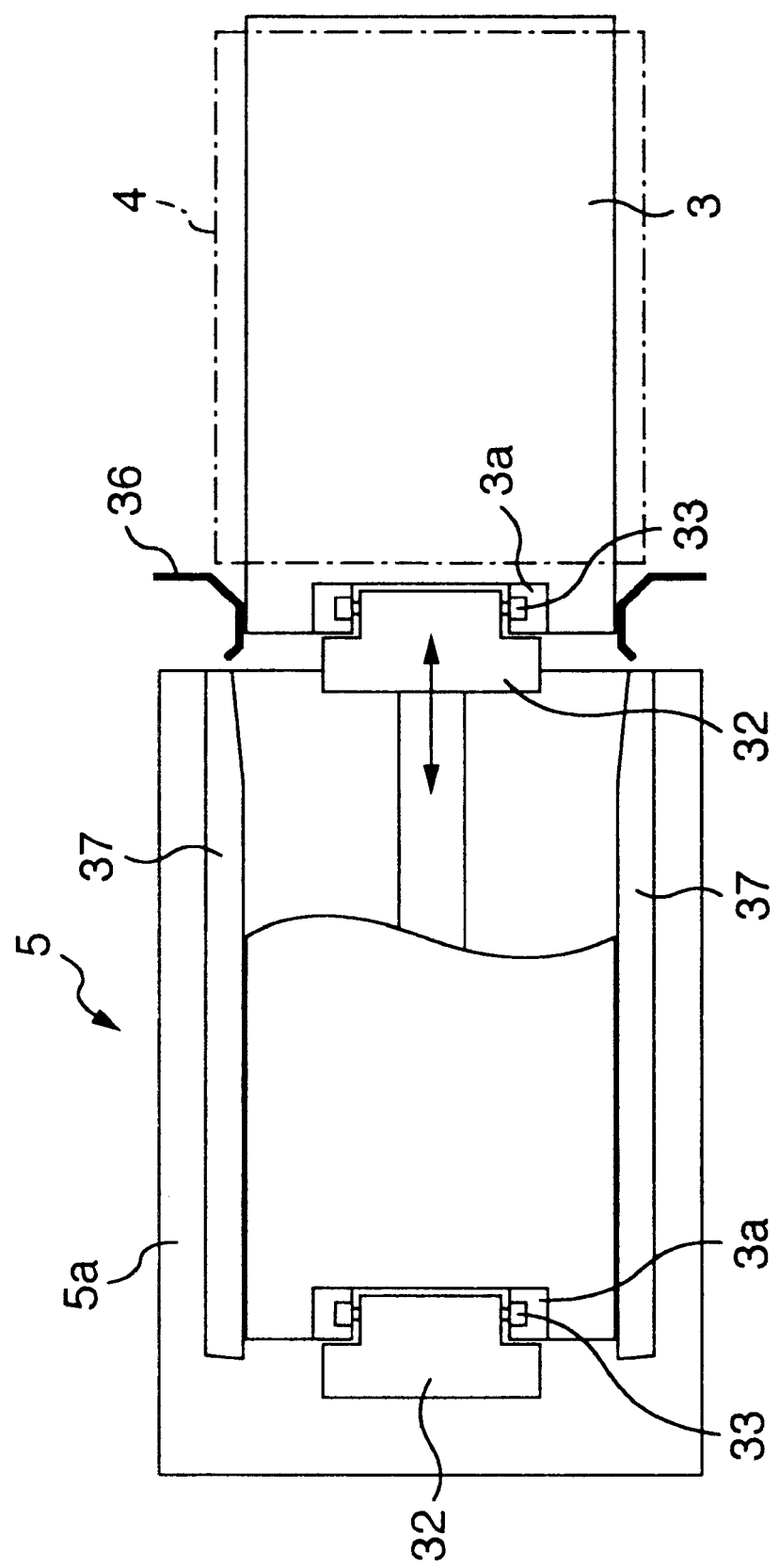

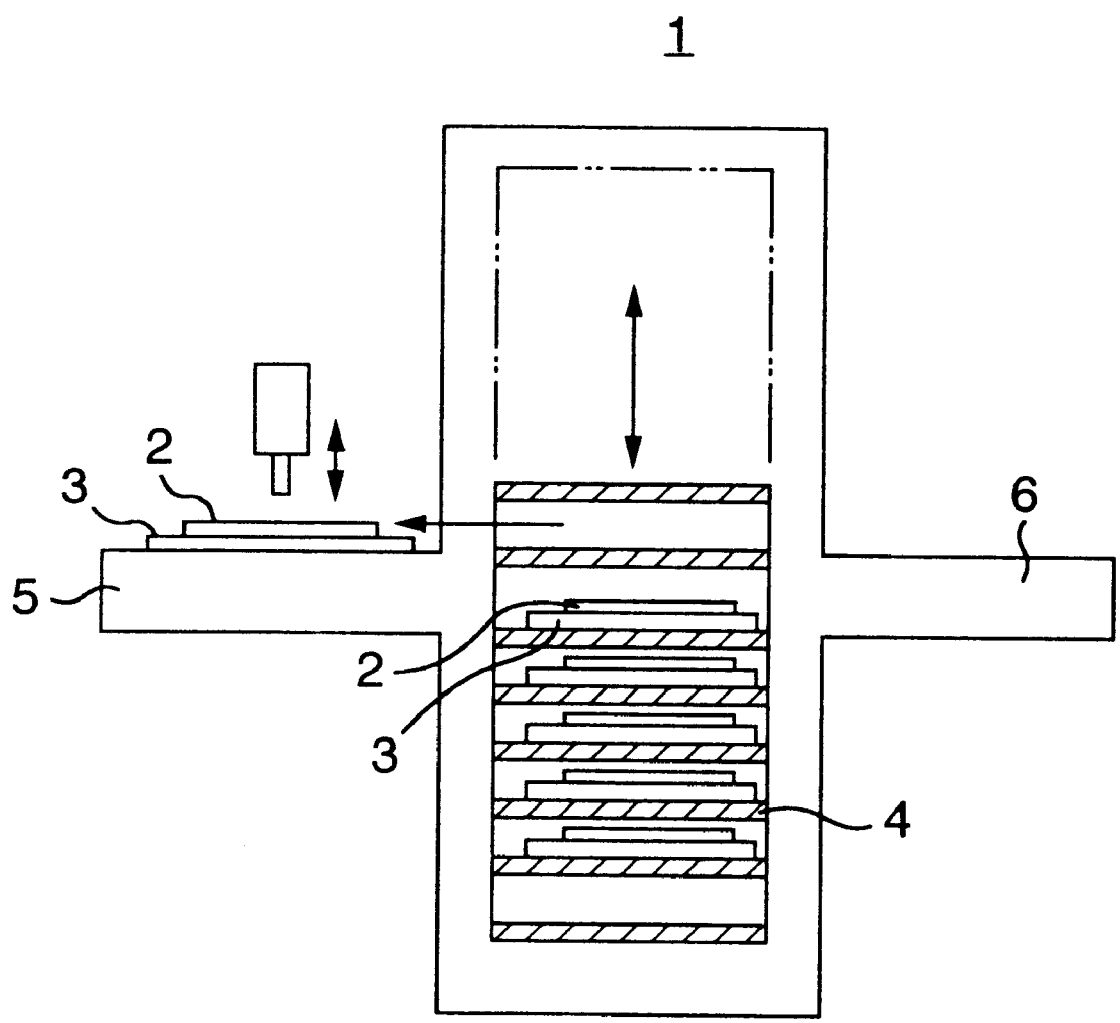

ELECTRONIC PARTS-FEEDING TRAY FEEDER AND ELECTRONIC PARTS-FEEDING METHOD

BACKGROUND OF THE INVENTION

This invention relates to an electronic parts-feeding tray feeder for containing trays, each storing electronic parts, and for feeding the trays to an electronic parts-mounting apparatus.

One known method of feeding electronic parts, such as semiconductor chips, uses a tray feeder. In this tray feeder, trays, each storing a plurality of electronic parts in a generally-flat manner, are received or contained in a container such as a magazine, and the trays are sequentially taken out of the magazine, and are fed to a pickup position of a transfer head. The conventional tray feeder will be described below with reference to a drawing.

FIG. 7 is a sectional side view of the conventional tray feeder. In FIG. 7, the tray feeder 1 comprises a magazine 4 containing a number of pallets 3 each holding a tray 2, and the magazine 4 is moved up and down by lifting-lowering means (not shown). A drawing portion 5, onto which the pallet 3 can be drawn from the magazine 4, is provided at that side of the tray feeder 1 facing an electronic parts-mounting apparatus. The pallet 3, holding the tray 2, is drawn onto the drawing portion 5 by a pallet-moving mechanism, and is fed to a pickup position of a transfer head. A replenishing portion 6 is provided on the rear side of the tray feeder 1, and the pallet, holding the empty tray, is transferred onto this replenishing portion 6, and the pallet, on which a fresh tray is installed, is recharged into the magazine through this replenishing portion 6.

The conventional tray feeder of the above construction, however, suffers from the following problems. First, the vertical position or height of the drawing portion 5 is fixed, and the magazine 4 is adapted to be moved up and down so as to draw the required pallet. With this construction, the height of the tray feeder body must be made higher than the level of a path of feed of the electronic parts by an amount larger than the height of the magazine. Therefore, the operator is prevented from viewing the interior of the electronic parts-mounting apparatus, and besides the efficiency of the maintenance-inspection operation is low. Furthermore, since the replenishing portion 6 projects toward the operator side, the area or space, occupied by the tray feeder, is large, and this is one of factors in the failure to achieve a space-saving construction of the tray feeder connected to the electronic parts-mounting apparatus. Thus, because of its overall construction, the conventional tray feeder has problems that the operation efficiency is low and that it is difficult to achieve a compact design of the tray feeder.

SUMMARY OF THE INVENTION

It is therefore an object of the present invention to provide an electronic parts-feeding tray feeder which achieves an excellent operation efficiency, and is compact in size.

An electronic parts-feeding tray feeder is disclosed, including a container containing a plurality of pallets in a stacked manner, each of the pallets holding a tray storing electronic parts, the pallets being sequentially taken out of the container, and then being fed to a pick-up position where the electronic parts are picked up by a transfer head of an electronic parts-mounting apparatus a drawing portion for drawing the pallet from the container to be placed thereon, lifting-lowering means for vertically moving the drawing portion; a non-mounted-parts discharge portion provided above the container so as to receive those electronic parts which are not mounted and are to be discharged; and a replenishing portion for receiving the pallet, holding the empty tray from which the electronic parts have been picked up, and for recharging the pallet after fresh electronic parts are replenished.

In a preferred embodiment, a plurality of containers are arranged in a vertical direction, which can be removed from the tray feeder independently of each other.

According to the invention, there is provided the lifting-lowering means which vertically moves the drawing portion for drawing the pallet from the container, which contains a plurality of pallets, and for carrying the same thereon. The non-mounted-parts discharge portion for receiving those electronic parts, which are not mounted and are to be discharged, and the replenishing portion for receiving the empty tray and for recharging the pallet are provided above the container. With this construction, there can be achieved the electronic parts-feeding tray feeder which is excellent in operation efficiency, and is compact in size.

BRIEF DESCRIPTION OF THE DRAWINGS

FIG. 4 is a plan view showing the magazine and a pallet of the electronic parts-feeding tray feeder according to the embodiment of the invention;

FIG. 7 is a sectional side view of a conventional tray feeder.

DESCRIPTION OF THE PREFERRED EMBODIMENT

Figure 1A:
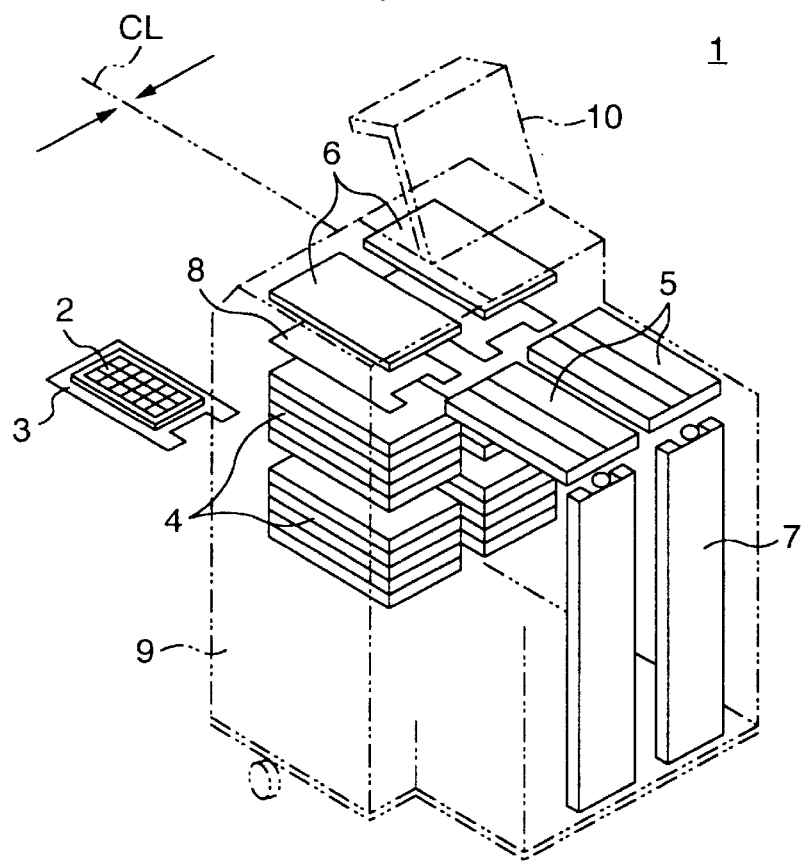
FIG. 1A is a perspective view of one preferred embodiment of an electronic parts-feeding tray feeder of the present invention.
Figure 1B:
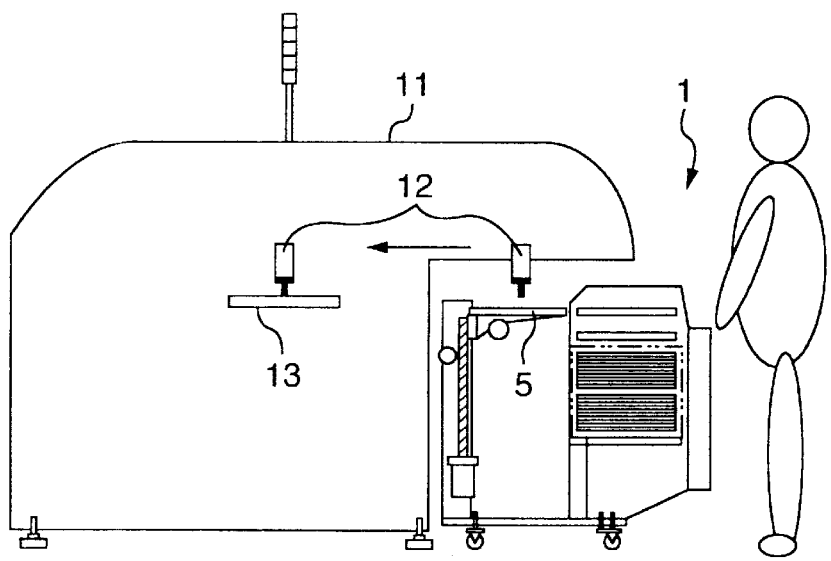
FIG. 1B is a view showing the state of the electronic parts-feeding tray feeder of the invention connected to an electronic parts-mounting apparatus.
Figure 2:
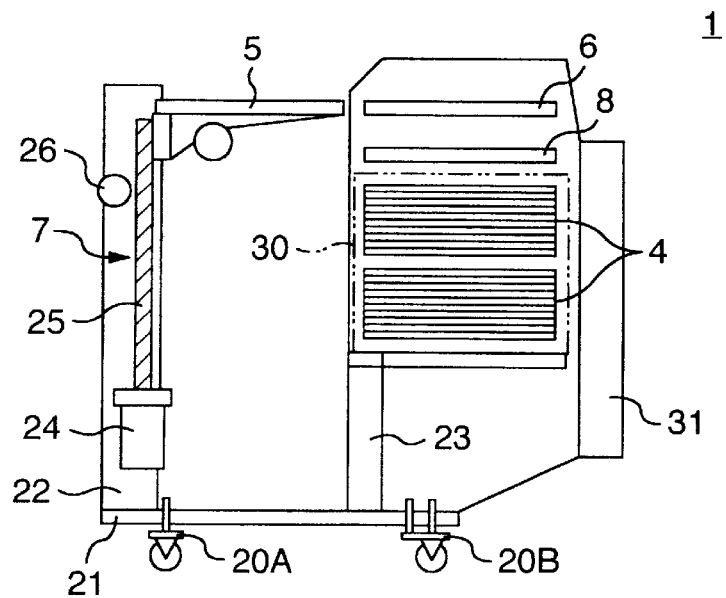
FIG. 2 is a side view of the electronic parts-feeding tray feeder according to the embodiment of the invention.
Figure 3:
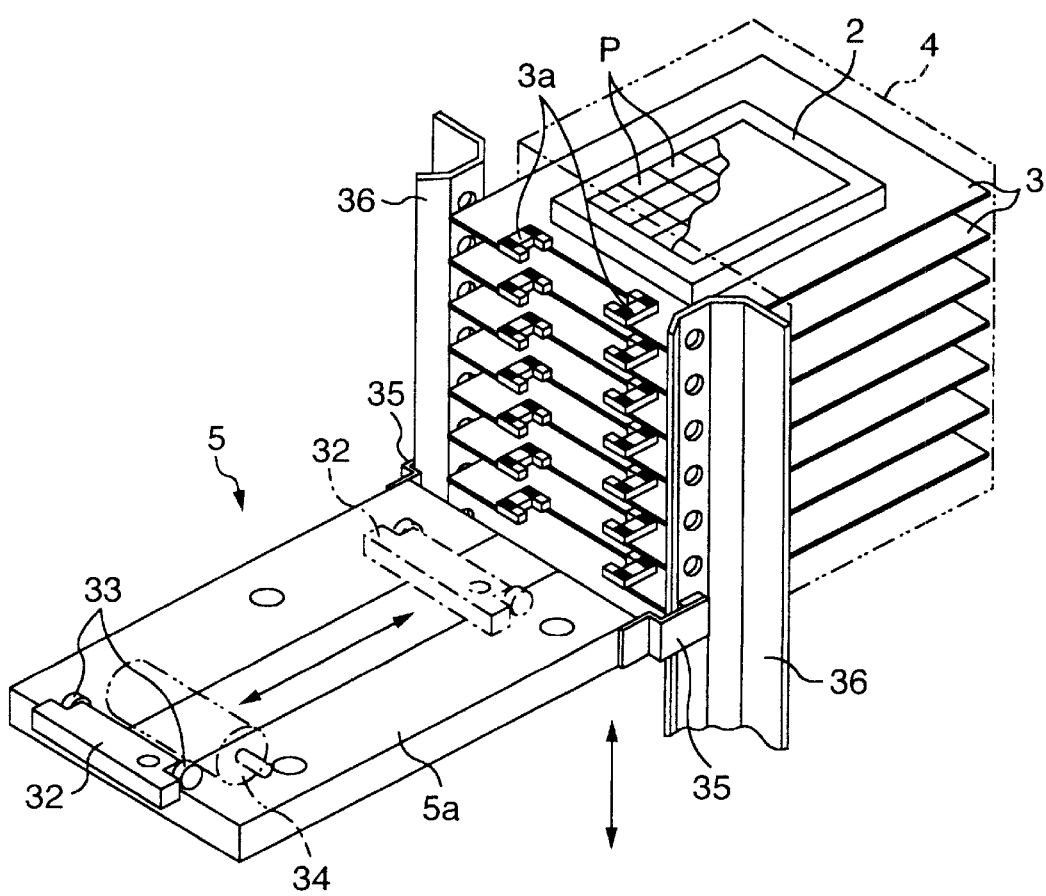
FIG. 3 is a perspective view showing a magazine and a drawing portion of the electronic parts-feeding tray feeder according to the embodiment of the invention.
Figure 5A:
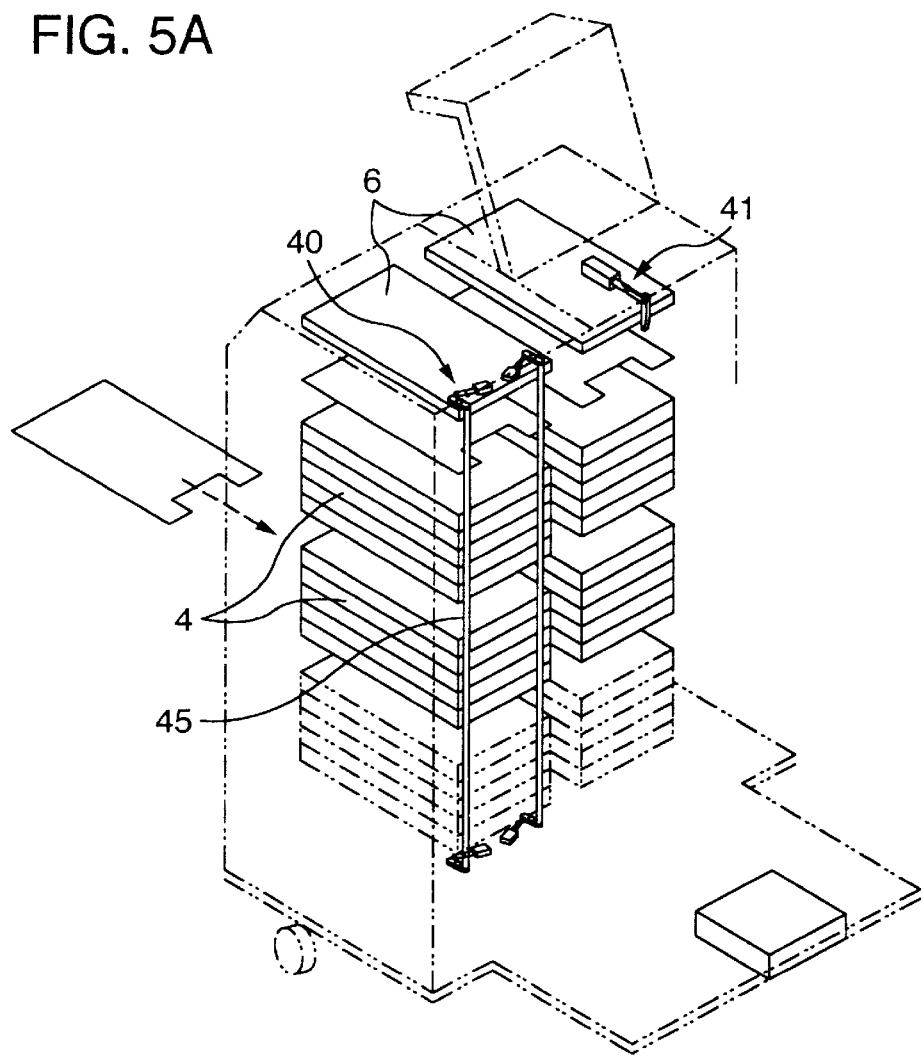
FIG. 5A is a perspective view of the electronic parts-feeding tray feeder according to the embodiment of the invention.
Figure 5B:
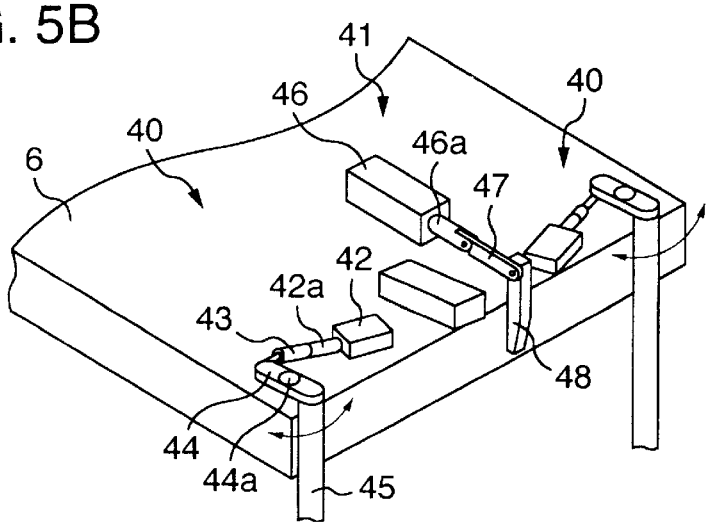
FIG. 5B is a perspective view of a portion of the electronic parts-feeding tray feeder according to the embodiment of the invention.

A preferred embodiment of the invention will now be described with reference to the drawings. FIG. 1A is a perspective view of the electronic parts-feeding tray feeder according to the embodiment of the invention, FIG. 1B is a view showing the state of the electronic parts-feeding tray feeder connected to an electronic parts-mounting apparatus, FIG. 2 is a side view of the electronic parts-feeding tray feeder, FIG. 3 is a perspective view of a magazine and a drawing portion in the electronic parts-feeding tray feeder, FIG. 4 is a plan: view of the magazine and a pallet in the electronic parts-feeding tray feeder, FIG. 5A is a perspective view of the electronic parts-feeding tray feeder, FIG. 5B is a perspective view of a portion of the electronic parts-feeding tray feeder, and FIGS. 6A to 6D are views explanatory of the operation of shutter mechanisms in the electronic parts-feeding tray feeder.

First, the overall construction of the tray feeder will be described with reference to FIG. 1. In FIG. 1A, a pair of pallet supply mechanisms of an identical construction are provided in the tray feeder 1, which are arranged symmetrically right and left with respect to a center plane CL. A tray 2, storing a number of electronic parts in a grid-like manner, is installed on the pallet 3, and a number of such pallets 3 are contained in a stacked manner in the magazine 4. A set of magazines 4 are provided in each of the right and left pallet supply mechanisms, and are fixed in a vertical direction. The drawing portion 5 is provided at that side (front side in FIG. 1A) of each set of magazines 4 facing the electronic parts-mounting apparatus, which is adapted to draw the pallet 3 from the magazine 4 and carry the same thereon. The drawing portion 5 of each pallet supply mechanism can be moved up and down by a lifting-lowering portion 7 that serves as lift means.

A non-mounted-parts discharge portion 8 for receiving electronic parts, which are not mounted and are to be discharged, is provided above the upper magazine 4 in each pallet supply mechanism, and further an electronic parts-replenishing portion 6 is provided above the non-mounted-parts discharge portion 8. The electronic parts-replenishing portion 6 is for taking the pallet, holding the empty tray from which the electronic parts have been picked up, and for recharging the pallet, holding a fresh tray storing electronic parts, into the magazine.

The above elements are housed within a cover casing 9, and an openable cover 10 is provided above each of the replenishing portions 6. Similarly, an openable door is provided at the rear side of each set of magazines 4, and through these covers and doors, the magazines 4 can be set in and removed from the tray feeder 1, and also the pallets 3 can be contained in each magazine 4.

As shown in FIG. 1B, when the tray feeder 1 is used, it is connected to the electronic parts-mounting apparatus 11. A raised position of each drawing portion 5 is a pick-up position where the electronic parts are picked up by a transfer head 12. The drawing portion 5 is lifted or raised, and this enables the pallets 3, sequentially drawn from the magazine 4, to be sequentially fed to the pick-up position of the transfer head 12. The electronic parts in the tray 2, held by each pallet 3, are picked up by the transfer head 12, and are mounted on a board 13 located at a mounting portion.

The structures of various portions of the tray feeder will be described. In FIG. 2, the tray feeder 1 is so constructed that a base member 21 is supported by casters 20A, 20 for horizontal movement, and frames 22, 23 are formed upright on the base member 21. The lifting-lowering portion 7, including a motor 24 and a feed screw 25, is mounted on the frame 22, and the drawing portion 5 is moved upward and downward by driving the lifting-lowering portion 7. A roller 26 for vertically positioning the tray feeder 1 is provided on the frame 22. The roller 26 is adapted to rest on a level-regulating portion, formed on the electronic parts-mounting apparatus 11, thereby conforming the level of the tray feeder 1 to a reference level of the electronic parts-mounting apparatus 11.

A magazine receiving portion 30 is fixedly secured to the frame 23, and the set of upper and lower magazines 4 are received in the magazine receiving portion 30. A door 31 is provided at the rear side of the magazine receiving portion 30, and the magazines 4 can be set in and removed from the magazine receiving portion 30 by opening this door 31. Storing the plurality of magazines 4 in the magazine receiving portion 30 offers advantages that the pallets can be arranged in various ways, and that while mounting the electronic parts on the board 13, using one magazine 4, the other magazine 4 can be removed from the magazine receiving portion 30, and then the pallets can be replenished and exchanged. The replenishing portion 6 and the non-mounted-parts discharge portion 8 are disposed above the magazine receiving portion 30. The functions of the replenishing portion 6 and the non-mounted-parts discharge portion 8 will be described later.

The pallet 3 to be received in the magazine 4, as well as the drawing portion 5 for drawing the pallet 3 and carrying the same thereon, will be described with reference to FIGS. 3 and 4. As shown in FIG. 3, the plurality of pallets 3 are received in the magazine 4 in a stacked manner, and these pallets 3 rest on a number of racks (not shown), respectively. The tray 2, storing a number of electronic parts P in a grid-like manner, is attached to each pallet 3. Engagement portions 3a, each having a notch, are provided at a front end (left end in FIG. 3) of the pallet 3.

Two guide members 36 are provided at the front side of the magazines 4 and extend vertically. Slide members 35 are provided at a front end of a table 5a of the drawing portion 5, which can be moved up and down at the front side of the magazines 4, to be slidable along the guide members 36. The table 5a is adapted to move up and down while kept in a predetermined posture relative to the magazines 4.

The drawing portion 5 has a pallet-moving mechanism, which is driven by a motor 34, and driving of the motor 34 causes a moving block 32 to reciprocally move on the table 5a as indicated by an arrow in FIG. 3. Two rollers 33 are mounted on the moving block 32. The rollers 33 are engaged in the notches of the engagement portions 3a of the pallet 3, and in this condition the moving block 32 is moved reciprocally to draw the pallet 3 from the magazine 4 onto the table 5a and to move the pallet 3 back into the magazine 4, as shown in FIG. 4. During this reciprocal movement of the pallet 3, the pallet 3 is kept in a predetermined posture by the vertically-extending guide members 36 and two guide rails 37 mounted on the table 5a.

The shutter mechanism for the pallets 3 and that for the replenishing portion 6 will be described with reference to FIGS. 5 and 6. As shown in FIG. 5A, the shutter mechanism 40 for the magazines and the shutter mechanism 41 for each replenishing portion 6 are provided on the upper surface of the replenishing portion 6. Although FIG. 5A is depicted as if the magazine shutter mechanism 40 is provided on the left replenishing portion 6 while the replenishing portion shutter mechanism 41 is on the right replenishing portion 6, actually, the magazine shutter mechanism 40 and the replenishing portion shutter mechanism 41 are provided on each of the right and left replenishing portions 6 as shown in FIG. 5B.

The magazine shutter mechanism 40 is for regulating projection of the pallets 3 from the magazines 4 disposed below this shutter mechanism, and has two right and left bar-like members 45, which have a length covering the height of the magazines 4 and are disposed vertically at the front side of the magazines 4 for open and close motion. As shown in FIG. 5B, the magazine shutter mechanism 40 includes a pair of opening-closing drive cylinders 42, and lever members 44 are connected respectively to rods 42a of the cylinders 42 through connecting members 43. Each lever member 44 is pivotally movable about a pivot pin 44a, and the bar-like member 45 is fixedly secured to an end of the lever member 44. When the rod 42a of the cylinder 42 is extended and retracted, the lever member 44 is pivotally moved about the pivot pin 44a.

Figure 6A:
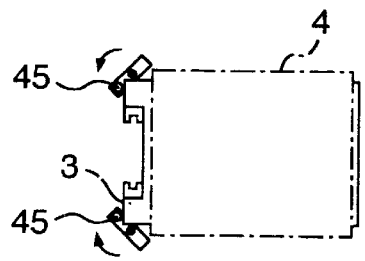
FIGS. 6A to 6D are views explanatory of the operation of shutter mechanisms of the electronic parts-feeding tray feeder according to the embodiment of the invention.
Figure 6B:
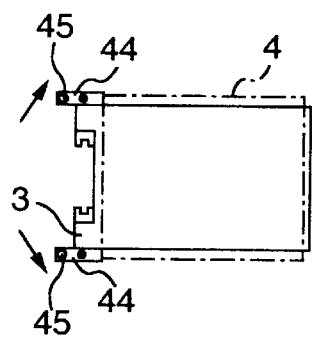

In an extended condition of the rods 42a, as shown in FIG. 6A, the bar-like members 45 lie at the front side of the magazines 4 to prevent the pallets 3 in the magazines 4 from projecting forwardly beyond a predetermined position. When the rods 42a are retracted, the bar-like members 45 are retracted from the front side of the magazines 4 as shown in FIG. 6B, so that the pallets 3 can be drawn forwardly from the magazines 4.

Figure 6C:
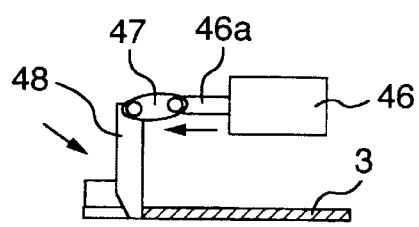
Figure 6D:
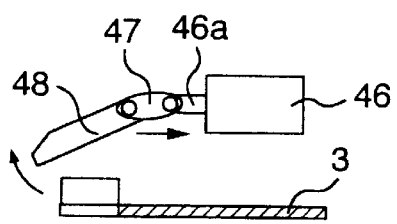

The replenishing portion shutter mechanism 41 is for preventing the pallet 3, received by the replenishing portion 6, from projecting from a reception position. As shown in FIG. 5B, this shutter mechanism 41 includes an opening-closing member 48 for pivotal movement between an upper and a lower position at the front side of the replenishing portion 6, and a cylinder 46 for moving the opening-closing member 48 between the open and closed positions. A rod 46a of the cylinder 46 is connected to the opening-closing member 48 through a connecting member 47 and pins. In an extended condition of the rod 46a, as shown in FIG. 6C, the opening-closing member 48 is in an upright posture to prevent the pallet 3 from projecting from the replenishing portion 6. When the rod 46a is retracted, the opening-closing member 48 is moved upwardly, as shown in FIG. 6D, to be evacuated from the front end of the pallet 3. Therefore, the pallet 3 is in a state capable of being drawn forwardly from the replenishing portion 6.

The electronic parts-feeding tray feeder has the above construction, and its operation will now be described. In FIG. 1, first, the pallets 3, each holding the tray 2 storing the electronic parts, are inserted into respective predetermined positions in the magazine 4. After the pallets 3 are thus received in the magazine 4, the magazine is set in the magazine receiving portion 30. When the electronic parts-mounting apparatus is operated to start the electronic parts-mounting operation, the drawing portion 5 is first moved vertically to the level of the pallet 3 having required electronic parts. Subsequently, the rollers 33 of the moving block 32 are brought into engagement with the engagement portions 3a of the pallet 3, respectively, as shown in FIG. 4, and in this condition the pallet moving mechanism is driven to move the moving block 32 toward the electronic parts-mounting apparatus, so that the pallet 3 is drawn onto the table 5a of the drawing portion 5.

Then, the drawing portion 5 is moved up to the pick-up position, and is stopped there. In this condition, the transfer head 12 is moved to a position above the drawing portion 5 as shown in FIG. 1B, and the electronic part in the tray 2 held on the pallet 3 is picked up by a suction nozzle of the transfer head 12. After that, the transfer head 12 is moved to a position above the board 13, and mounts the electronic part on this board 13.

During this part-mounting operation is repeated sequentially, when all of the electronic parts in one tray 2 are mounted on the board and this tray 2 becomes empty, the drawing portion 5 is moved up to the level of the replenishing portion 6, the pallet 3 having this empty tray on the table 5a is pushed onto the replenishing portion 6, and also an alarm, indicative of the absence of the electronic parts in the tray, is given. In response to this alarm, the operator may remove the pallet 3 concerned from the replenishing portion 6, exchange the empty tray with a fresh tray, and then put this pallet 3 back onto the replenishing portion 6. Then, this pallet 3 is drawn onto the drawing portion 5, and the drawing portion 5 is moved again to the pick-up position to continue the parts-mounting operation.

Next, the operation for discharging non-mounted parts will be described. In the electronic parts-mounting operation, each electronic part, held on the transfer head 12 by suction, is checked through a camera. This check of the electronic parts is effected in order to detect the inclusion of different parts and defective parts, and those electronic parts, which are judged improper for mounting by this detection, are not mounted on the board, and are discharged to the exterior.

This discharging operation will be described. When it is judged that, for instance, the electronic part, suction held by the transfer head 12, is defective in shape, the drawing portion 5 is moved to the level of the replenishing portion 6, and the pallet 3, having stored this defective part, is once moved from the table 5a onto the replenishing portion 6. Then, this empty table 5a is moved to the level of the non-mounted-parts discharge portion 8, and a discharge pallet, placed on the non-mounted-parts discharge portion 8, is drawn therefrom onto the table 5a. Here, the discharge pallet means a pallet exclusively used for receiving those electronic parts which are not mounted on the board and are to be discharged.

Thereafter, the table 5a is moved again to the pick-up position, and the electronic part, held by the transfer head 12, is placed on the discharge pallet on the table 5a, and then conducted is the operation for returning this discharge pallet to the non-mounted-parts discharge portion 8. This permits the non-mounted-parts, which can not be mounted on the board, for example, because of their defective shape, to be received in the non-mounted-parts discharge portion 8. Thereafter, the pallet 3, temporarily placed on the replenishing portion 6, is drawn therefrom onto-the table 5a, and the parts-mounting operation is continued. The pick-up position, the replenishing portion 6 and the non-mounted-parts discharge portion 8 are disposed near to one another, and therefore in this discharging operation, the exchange of the pallet 3 with the discharge pallet, as well as the re-placing of these pallets, can be done efficiently in a short time.

As having described above, the tray feeder has the above construction and offers the following advantages over the conventional tray feeder. First, holding the pallet-receiving magazines 4 in a fixed position and moving the pallet-drawing portion 5 up and down enable the height of the tray feeder to be reduced. Therefore, as compared with the conventional tray feeder, a good view of the electronic parts-mounting apparatus is ensured, and the maintenance efficiency and the operability can be improved. Further, disposing the replenishing portion 6, for taking out the empty pallet and for recharging the tray, above the magazines enables the area or space, occupied by the tray feeder, to be reduced, thus achieving a compact design of the tray feeder. Furthermore, since the non-mounted-parts discharge portion 8 and the replenishing portion 6 are disposed above the magazines 4 close to the pick-up position, the efficiency of the parts-replenishing operation, as well as that of the non-mounted-parts discharging operation, is enhanced.

According to the invention, there is provided the lifting-lowering means, which vertically moves the drawing portion for drawing the pallet from the container and carrying the same thereon. The non-mounted-parts discharge portion for receiving those electronic parts, which are not mounted on the board and are to be discharged, and the replenishing portion for receiving the empty tray and for recharging the pallet are provided above the container. With this construction, it is possible to realize the electronic parts-feeding tray feeder which is excellent in ease of operation and is compact in size.

What is claimed is:

1. A method of feeding electronic parts to a pick-up position, where the electronic parts are picked up by a transfer head of an electronic parts-mounting apparatus, by means of a plurality of trays operable to store the electronic parts, a plurality of pallets for holding the respective trays thereon, a container for containing the pallets in a stacked manner, a replenishing portion for the electronic parts provided above the container, and a drawing portion movable between the container, the replenishing portion and the pick-up position for drawing the pallet from the container and moving the pallet, the method comprising the steps of:

storing electronic parts in each of the trays;

placing the trays on respective pallets and putting the sets of trays and pallets, thus formed, into the container;

moving one of the sets of trays and pallets out of the container onto the drawing portion;

moving the drawing portion to transport the one set of trays and pallets to the pick-up position;

when the one set of trays and pallets becomes empty of the electronic parts through taking-out by the transfer head of the electronic parts-mounting apparatus, moving the drawing portion to transport the one set of trays and pallets to the replenishing portion; and transferring the one set of trays and pallets onto the replenishing portion.

2. The method according to claim 1 further comprising the step of giving an alarm indicative of the absence of the electronic parts after having transferred the one set of trays and pallets onto the replenishing portion.

3. The method according to claim 1 further comprising the steps of:

replacing the empty tray on the replenishing portion with another tray in which the electronic parts are stored;

transferring the other tray along with an associated pallet from the replenishing portion onto the drawing portion; and moving the other tray and the associated pallet to the pick-up position.

\* \* \* \* \*